United States Patent [19]

Scott, Jr. et al.

[11] 4,201,603

[45] May 6, 1980

[54] METHOD OF FABRICATING IMPROVED SHORT CHANNEL MOS DEVICES UTILIZING SELECTIVE ETCHING AND COUNTERDOPING OF POLYCRYSTALLINE SILICON

[75] Inventors: Joseph H. Scott, Jr., Plainsboro; Alfred C. Ipri, Princeton, both of N.J.

[73] Assignee: RCA Corporation, New York, N.Y.

[21] Appl. No.: 966,510

[22] Filed: Dec. 4, 1978

[51] Int. Cl.[2] .................. H01L 21/225; H01L 21/308
[52] U.S. Cl. .................... 148/174; 29/571; 29/578; 29/580; 148/1.5; 148/175; 148/187; 148/190; 156/628; 156/657; 357/4; 357/23; 357/49; 357/59; 357/91; 427/85
[58] Field of Search .............. 148/174, 175, 187, 190, 148/1.5; 156/628, 644, 648, 657; 29/571, 578, 580; 427/85; 357/4, 23, 49, 59, 91

[56] References Cited

U.S. PATENT DOCUMENTS

| | | | |
|---|---|---|---|
| 3,600,651 | 8/1971 | Duncan | 148/187 X |
| 3,738,880 | 6/1973 | Laker | 156/628 |
| 3,980,507 | 9/1976 | Carley | 357/59 X |
| 4,026,733 | 5/1977 | Owen et al. | 148/1.5 |
| 4,026,740 | 5/1977 | Owen | 156/628 |
| 4,057,824 | 11/1977 | Woods | 357/4 X |
| 4,057,895 | 11/1977 | Ghezzo | 29/580 X |
| 4,093,503 | 6/1978 | Harris et al. | 156/628 |
| 4,124,933 | 11/1978 | Nicholas | 29/578 |

FOREIGN PATENT DOCUMENTS 1477512  6/1977  United Kingdom .

Primary Examiner—L. Dewayne Rutledge
Assistant Examiner—W. G. Saba
Attorney, Agent, or Firm—Birgit E. Morris; D. S. Cohen; Lawrence P. Benjamin

[57] ABSTRACT

A method for fabricating a short channel MOS device is described wherein the conductivity of the gate member is increased by a factor of about 2.5 by counterdoping a P-type doped polycrystalline line with an N-type dopant.

8 Claims, 5 Drawing Figures

METHOD OF FABRICATING IMPROVED SHORT CHANNEL MOS DEVICES UTILIZING SELECTIVE ETCHING AND COUNTERDOPING OF POLYCRYSTALLINE SILICON

This invention relates, in general, to narrow gate fabrication techniques and more particularly to a method for achieving lower line resistivity in the manufacture of narrow gate semiconductor devices.

In a co-pending application entitled METHOD OF MAKING NARROW SILICON LINES AND SEMICONDUCTOR DEVICES MADE WITH SUCH LINES, Ser. No. 852,931, filed Nov. 18, 1977, now abandoned, and assigned to the same assignee of the subject application, there is described a short channel semiconductor device and the method of fabricating it.

In another co-pending application entitled SHORT CHANNEL MOS DEVICES AND THE METHOD OF MANUFACTURING SAME, Ser. No. 897,807 filed Apr. 19, 1978 and assigned to the same assignee of the subject application, there is described a device and method for manufacturing a short channel semiconductor device capable of achieving higher operating voltages. Both aforementioned applications are incorporated herein, in its entirety by reference.

The first of the above mentioned applications is directed to short or narrow gates formed by the controlled doping of only those exposed edges of a layer of polycrystalline silicon (polysilicon) and the subsequent etching of the undoped portion. The last mentioned application is an improvement on the first application and deals with a solution for achieving higher voltage background by doping the source and drain to different levels. The net result being a device having a source region doped to a considerably higher level than the drain region.

The subject application represents an improvement over both prior applications. In each of the aforementioned applications, the processing steps included the use of a boron doped polysilicon gate as an alignment device for a subsequent doping step in order to produce the source and drain regions. These processing steps involve the initial formation of the narrow gate polysilicon by doping the exposed edge of a layer of polysilicon. Since the diffusion constant of boron (in the form of diborane) into a polysilicon layer is well known, the diffusion may be accurately controlled by monitoring the time and temperature of the diffusion. Accordingly, the width of the resultant doped polysilicon can be accurately controlled to provide narrow widths.

However, in order to achieve the subsequent selective etching created by the presence of doped and undoped areas, the process is fairly well limited to the use of boron as a dopant. In addition, it is necessary for the polysilicon line to be doped to its maximum solubility level of boron in order to exhibit the selective etching characteristic. This limitation presents some difficulties since a boron doped line will have a higher resistivity and a lower conductivity then either an arsenic or phosphorus doped line. Typically, the described processes produce silicon lines which are doped to a concentration $C_B \approx 2 \times 10^{20}/cm^3$ and have a sheet resistance of only slightly less than 100 ohms/square. Since the speed of integrated circuits is limited by the silicon sheet resistance, it is highly desirable to lower this resistance.

In accordance with the teachings of our invention a short channel device and method for fabricating the device is hereinafter described wherein the concentration of conductivity modifiers in the gate member is significantly altered to raise its conductivity. In the described embodiment, the gate member is defined by edged doping as in the prior art methods. Thereafter the boron dopant therein (produced by the processing steps) is counterdoped with, for example, phosphorus or arsenic to its maximum level of solubility in order to produce a lower resistance line with a concomitantly higher conductivity. The presence of phosphorus as a dopant impurity introduces electrons, which, by its nature, has a higher degree of mobility than the holes which are present as a result of the boron implantation. The net result is higher conductivity.

Figure 1:
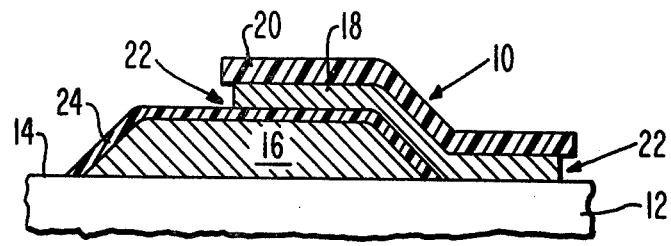
FIGS. 1, 2, 3 and 4 are sectional views illustrating the steps of carrying out the method of the present invention.

Referring now to FIG. 1, there is herein presented one method of fabricating a silicon-on-sapphire short channel, MOS device embodying the subject invention. While the following exegesis will be presented in terms of a silicon-on-sapphire device, it will be obvious to those skilled in the art that while body 12 will be referred to as sapphire other insulative substrates such as spinel or monocrystalline beryllium oxide may be used with no deleterious effects. Further, while body 12 may be a substrate of insulating material it should also be obvious that it may either be a semiconductor material or a layer of a semiconductor material on a substrate, depending on the device being made. Additionally, while there will be described the fabrication of an N channel device, we do not wish to be so limited since it is readily obvious that a P channel device may also be fabricated using the teachings of our invention by making the appropriate substitutions therein.

The construction of the configuration of structure 10 is described in detail in the previously mentioned co-pending application Ser. No. 852,931. In that application, a layer of monocrystalline silicon is deposited on surface 14 of body 12 using any one of many well known techniques one of which is the thermal decomposition of silane in a hydrogen carrier. After the deposition of the silicon layer, the layer is masked to expose certain areas and the exposed areas are then etched down to the substrate with the unetched areas forming a body or island of silicon 16. Thereafter, island 16 is provided with a layer of dielectric or dielectrics 24 which may be formed either by the oxidation of the surface of silicon island 16 or by the thermal decomposition of silane in an oxidizing atmosphere. Island 16 is next provided with a polysilicon layer 18 (over layer 24) followed by a layer 20 of masking oxide, utilizing any one of many well known techniques. Layer 20 is then provided with a patterned layer of photoresist(not shown) and the exposed portion of masking oxide layer 20 is etched down to polycrystalline silicon layer 18 in order to allow the remaining, unetched portions of layer 20 to act as a mask for the subsequent etching of layer 18. At this point, all exposed portions of polysilicon layer 18 are removed by subjecting structure 10 to a buffered potassium hydroxide etchant which, not only removes the exposed polysilicon but will generally etch under the edges of masking layer 20. These techniques are also well known.

Structure 10 is then subjected to a P-type dopant and heated. The particular dopant used for the P-type doping of the exposed portions of polysilicon layer 18 is boron which may be in the form of diborane. As indicated by arrows 22, the dopant gas will contact only the exposed edges of polysilicon layer 18 so that the dopant will diffuse into layer 18 laterally along the polysilicon layer, from the exposed edges inwardly thereof. This procedure forms a P-type doped polysilicon strip 18.1 along each of the exposed edges of polysilicon layer 18. Since the diffusion constant of boron into polysilicon layer 18 is well known, the diffusion of the dopant into layer 18 may be accurately controlled by monitoring the time and temperature of the diffusion. Accordingly, the width of the resultant doped polysilicon strips 18.1 can be accurately controlled to provide narrow widths. This boron doping step is carried on until the solid solubility of the boron dopant in silicon has reached its limit. Typically, a boron doping operation is carried on at a temperature of about 900° C. for about 100 minutes using diborane as the dopant until a solubility limit of about $2.3 \times 10^{20}/cm^3$ conductivity modifiers has been reached.

Figure 2:
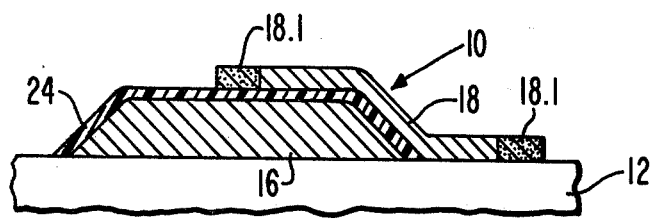

As shown in FIG. 2 doped strips 18.1 appear whereever the exposed edges of polysilicon layer 18 reacted with the boron dopant. In this particular embodiment, we have chosen to form a closed loop gate although other configurations will now become obvious. As shown in FIG. 2, after the formation of doped strips 18.1, masking silicon dioxide layer 20 is removed using a buffered hydrogen fluoride solution to expose the doped (18.1) and the undoped (18) portions of the polysilicon layer.

Figure 3:
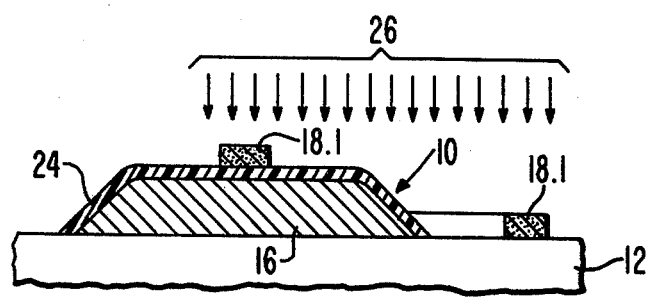

Referring now to FIG. 3, the next step is to remove undoped portions 18 of polysilicon which may be done by subjecting device 10 to a suitable etching solution until such time as all undoped polysilicon is removed. Such solvents are described in U.S. Pat. No. 3,738,880 issued to A. Laker, on June 13, 1973, and include aqueous hydrazine or potassium hydroxide-propanol solutions and the like. The use of any of these solutions will selectively remove only the undoped portions 18 of polysilicon leaving doped polysilicon strips 18.1 unaffected.

The next step is to counterdope boron doped strips 18.1 with an N+ dopant such as phosphorus or arsenic as shown by arrows. The use of phosphorus or arsenic produce a twofold benefit in that both impurities have higher solubility limits, in silicon, than the boron dopant, and in addition, either impurity introduces electrons which, by its nature has a higher degree of mobility than the holes that are present as a result of the boron doping. This counterdoping step for obtaining for example a phosphorus doped silicon line consists of placing the device in a gaseous phosphorus ambient ($POCL_3$, $PH_3$), or the like, at a temperature above the boron diffusion temperature for a sufficient period of time to convert the polysilicon line 18.1 from P to N+. For example, if as previously mentioned the polysilicon line had been diffused with boron at about 900° C. for about 100 minutes the counterdoping would be done in a phosphorus diffusion furnace at about 1050° C. for about 15 minutes. This would be sufficient to counterdope the polysilicon from P type to N type. In such a situation, the solid solubility of phosphorus is of the order of about $1.4 \times 10^{21}/cm^3$ conductivity modifiers.

Figure 4:
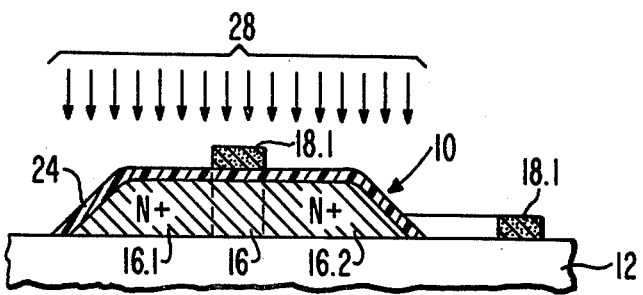

Referring now to FIG. 4, it will be seen that by using strips 18.1 as a mask, the device is subjected to a phosphorus ion implantation step, as indicated by arrows 29, which delineate the outer edges of the channel and form source and drain regions 16.1 and 16.2 respectively. The ion implantation, at a dose of about $1 \times 10^{14}$ ions/$cm^2$, at 50 KeV resulting in the completion of the channel region and the formation of drain and source regions, which latter regions will have a concentration of about $10^{19}/cm^3$ conductivity modifiers.

Figure 5:
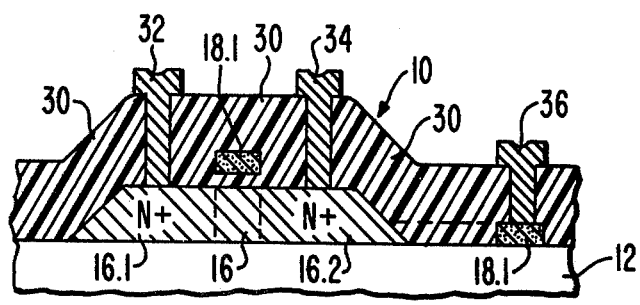
FIG. 5 is a sectional view of the short-channel MOS device made in accordance with the method of the present invention.

Thereafter, as shown in FIG. 5, the device is completed by the formation of field oxide 30 in a well known manner followed by the formation of contact openings and the depositin of metallic contacts 32, 34, and 36 in ohmic contact with source 16.1, drain 16.2 and gate 18.1 respectively.

There is thus provided a novel short channel MOS device wherein the conductivity of the gate line has been markedly increased by counterdoping with an N+ dopant. This is done by counterdoping boron with, for example, a phosphorus dopant having a higher solubility limit than the boron and by substituting free electrons for the previously present holes.

What is claimed is:

1. In a method of making a semiconductor device which includes the steps of forming a uniform layer of polycrystalline silicon having an exposed edge over the silicon body, forming a masking layer on the polycrystalline silicon layer, the masking layer extending at least to the exposed edge of the polycrystalline silicon layer, embedding a dopant into the exposed edge of the polycrystalline silicon layer for a desired distance laterally along the polycrystalline silicon layer in order to transform the uniform layer to a selectively etchable layer, removing the masking layer, and selectively etching the polycrystalline silicon layer to remove the undoped portion thereof, the improvement comprising:

counterdoping the doped portions of the polycrystalline silicon layer to raise the conductivity thereof.

2. The method in accordance with claim 1, in which:
the dopant utilized to produce the selectively etchable layer is a P-type dopant; and
the counterdopant is an N-type dopant.

3. The method in accordance with claim 2, in which:
the P-type dopant is boron; and
the N-type dopant is selected from the group consisting of phosphorus and arsenic.

4. The method in accordance with claim 3, in which:
the doped portion of the polycrystalline silicon layer is doped to the limit of solubility of the P-type dopant; and
the doped portion of the polycrystalline silicon layer is counterdoped to the solubility limit of the N-type dopant.

5. The method in accordance with claim 4, in which:
the P type dopant is of the order of about $2.3 \times 10^{20}/cm^3$ conductivity modifiers.

6. The method in accordance with claim 5, in which:
the counterdoping is done with phosphorus as the counterdopant; and
the counterdoping is carried on at about 1050° C. for a period of about 15 minutes.

7. The method in accordance with claim 6, in which:
the solubility limit of the phosphorus counterdopant is of the order of about $1.4 \times 10^{21}/cm^3$ conductivity modifiers.

8. The method in accordance with claim 7, in which:
the body of silicon is an island formed on an insulative substrate; and
the insulative substrate is selected from the group consisting of sapphire, spinel and monocrystalline beryllium oxide.

* * * * *